United States Patent
Ban et al.

(10) Patent No.: US 11,587,965 B2
(45) Date of Patent: Feb. 21, 2023

(54) DISPLAY PANEL AND MANUFACTURING METHOD THEREOF, DISPLAY DEVICE AND OPERATION METHOD THEREOF (71) Applicant: BOE TECHNOLOGY GROUP CO., LTD., Beijing (CN)

(72) Inventors: Shengguang Ban, Beijing (CN); Zhanfeng Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 471 days.

(21) Appl. No.: 16/470,722

(22) PCT Filed: Nov. 9, 2018

(86) PCT No.: PCT/CN2018/114836
§ 371 (c)(1),
(2) Date: Jun. 18, 2019

(87) PCT Pub. No.: WO2019/205576
PCT Pub. Date: Oct. 31, 2019

(65) Prior Publication Data
US 2021/0343769 A1 Nov. 4, 2021

(30) Foreign Application Priority Data
Apr. 26, 2018 (CN) .......................... 201810388269.X (51) Int. Cl.
*H01L 27/146* (2006.01)
*G02F 1/1335* (2006.01)
(Continued)

(52) U.S. Cl.
CPC .. *H01L 27/14621* (2013.01); *G02F 1/133516* (2013.01); *G02F 1/133519* (2021.01);
(Continued)

(58) Field of Classification Search
CPC ......... G02F 1/133514; G02F 1/136222; G02F 2203/34
See application file for complete search history.

(56) References Cited

U.S. PATENT DOCUMENTS 4,733,948 A * 3/1988 Kitahara ........... G02F 1/133512
349/111
9,360,700 B2 6/2016 Niu
(Continued)

FOREIGN PATENT DOCUMENTS

| CN | 101387771 A | 3/2009 |
| CN | 102160023 A | 8/2011 |

(Continued)

OTHER PUBLICATIONS

International Search Report of PCT/CN2018/114836 in Chinese, dated Jan. 30, 2019, with English translation.
(Continued)

*Primary Examiner* — Lauren Nguyen
(74) *Attorney, Agent, or Firm* — Collard & Roe, P.C.

(57) ABSTRACT

A color filter (CF) substrate, a manufacturing method thereof, a display panel, a display device and an operation method thereof are provided. The CF substrate includes: a base substrate, a CF pixel array and image sensors. The CF pixel array is provided on the base substrate and includes CF pixel units in an array. The image sensors are provided on the CF pixel array, correspond to the CF pixel units, and are configured to receive light travelling through the CF pixel units for imaging.

19 Claims, 10 Drawing Sheets (51) Int. Cl.
  *H01L 25/18* (2006.01)
  *H01L 27/32* (2006.01)
  *H04N 5/225* (2006.01)
  *G02F 1/1368* (2006.01)

(52) U.S. Cl.
  CPC ........ *G02F 1/133612* (2021.01); *H01L 25/18* (2013.01); *H01L 27/14685* (2013.01); *H01L 27/322* (2013.01); *H04N 5/2253* (2013.01); *H04N 5/2257* (2013.01); *G02F 1/1368* (2013.01); *G02F 2201/501* (2013.01); *H01L 27/3244* (2013.01)

(56) References Cited

U.S. PATENT DOCUMENTS

| | | |
|---|---|---|
| 9,575,357 B2 | 2/2017 | Yao et al. |
| 2002/0030768 A1 | 3/2002 | Wu |
| 2006/0145223 A1* | 7/2006 | Ryu ............... H01L 27/14621 257/294 |
| 2009/0073150 A1 | 3/2009 | Shih et al. |
| 2009/0104545 A1 | 4/2009 | Chen et al. |
| 2011/0169771 A1 | 7/2011 | Fujioka et al. |
| 2013/0252667 A1 | 9/2013 | Senda |
| 2017/0140702 A1 | 5/2017 | Li et al. |
| 2019/0103063 A1 | 4/2019 | Liu et al. |

FOREIGN PATENT DOCUMENTS

| | | | | |
|---|---|---|---|---|
| CN | 102707484 A | 10/2012 | | |
| CN | 103327167 A | 9/2013 | | |
| CN | 103901653 A | 7/2014 | | |
| CN | 10-4570449 | * 4/2015 | ............ | G02F 1/133 |
| CN | 104570449 A | 4/2015 | | |
| CN | 104730754 A | 6/2015 | | |
| CN | 106710524 A | 5/2017 | | |
| CN | 107608114 A | 1/2018 | | |
| JP | H08214197 A | 8/1996 | | |

OTHER PUBLICATIONS

Notice of Transmittal of the International Search Report of PCT/CN2018/114836 in Chinese, dated Jan. 30, 2019.

Written Opinion of the International Searching Authority of PCT/CN2018/114836 in Chinese, dated Jan. 30, 2019 with English translation.

Chinese Office Action in Chinese Application No. 201810388269.X, dated Apr. 22, 2020 with English translation.

Extended European Search Report in European Application No. 18889943.9 dated Dec. 14, 2021.

* cited by examiner

DISPLAY PANEL AND MANUFACTURING METHOD THEREOF, DISPLAY DEVICE AND OPERATION METHOD THEREOF

CROSS REFERENCE TO RELATED APPLICATIONS

This application is the National Stage of PCT/CN2018/114836 filed on Nov. 9, 2018, which claims priority under 35 U.S.C. § 119 of Chinese Application No. 201810388269.X filed on Apr. 26, 2018, the disclosure of which is incorporated by reference.

TECHNICAL FIELD

Embodiments of the present disclosure relate to a color filter (CF) substrate, a manufacturing method thereof, a display panel, a display device and an operation method thereof.

BACKGROUND

Intelligent electronic products, such as mobile phones and tablet PCs, are usually additionally equipped with imaging elements for image information recording, and the imaging elements utilize ambient light for imaging. For example, in an electronic product having display function, a shot lens is disposed in a non-display area and utilizes ambient light for imaging to realize shooting function, but a shot lens dedicated to photographing must be disposed in the non-display area.

SUMMARY

At least one embodiment of the present disclosure provides a color filter (CF) substrate, comprising a base substrate; a CF pixel array and image sensors. The CF pixel array is provided on the base substrate and includes CF pixel units in an array, and the image sensors are provided on the CF pixel array, correspond to at least part of CF pixel units, and are configured to receive light travelling through the CF pixel units for imaging.

For example, the CF substrate provided by an embodiment of the present disclosure further comprises a first protective layer at least covering the CF pixel array, the image sensors being provided on the first protective layer.

For example, in the CF substrate provided by an embodiment of the present disclosure, the first protective layer is a single-layer structure or a multi-layer structure including silicon nitride, silicon oxide, or silicon oxynitride.

For example, the CF substrate provided by an embodiment of the present disclosure further comprises a second protective layer covering the CF pixel array and the image sensors on the CF pixel array.

For example, in the CF substrate provided by an embodiment of the present disclosure, material of the second protective layer is resin material.

For example, the CF substrate provided by an embodiment of the present disclosure further comprises a support substrate, the image sensors are provided on the support substrate, and the support substrate is fixed on the CF pixel array.

For example, in the CF substrate provided by an embodiment of the present disclosure, the image sensors include imaging pixel units; and the imaging pixel units are in one-to-one correspondence with the CF pixel units.

For example, in the CF substrate provided by an embodiment of the present disclosure, the CF pixel units include red pixel units, green pixel units, blue pixel units, yellow pixel units, cyan pixel units, and magenta pixel units.

At least an embodiment of the present disclosure also provides a display panel, comprising any of the CF substrates provided by embodiments of the present disclosure.

For example, the display panel provided by an embodiment of the present disclosure further comprises an array substrate cell-assembled with the CF substrate, and the image sensors are provided between the base substrate of the CF substrate and the array substrate.

For example, in the display panel provided by an embodiment of the present disclosure, the array substrate includes a driving pixel array, the driving pixel array corresponding to the CF pixel array of the CF substrate, the driving pixel array including open areas for display and a non-display area among the open areas, and an orthographic projection of the image sensors on the driving pixel array is within the non-display area.

For example, in the display panel provided by an embodiment of the present disclosure, the array substrate includes thin-film transistors (TFTs) provided in the non-display area; and the image sensors and the TFTs are at least partially overlapped in a direction perpendicular to the array substrate.

At least an embodiment of the present disclosure also provides a display device, comprising any of the display panels provided by embodiments of the present disclosure.

At least an embodiment of the present disclosure also provides an operation method of the display device, comprising executing a photographing operation by using the image sensors during the non-display operation of the display panel.

For example, in the operation method of the display device provided by an embodiment of the present disclosure, the display device further includes a backlight; and the operation method further comprises turning off the backlight during the photographing operation.

At least an embodiment of the present disclosure also provides a method of manufacturing a color filter (CF) substrate, comprising: providing a base substrate; forming a CF pixel array on the base substrate, the CF pixel array including CF pixel units arranged in an array; and forming image sensors on the CF pixel array, the image sensors corresponding to at least part of the CF pixel units and configured to receive light travelling through the CF pixel units for imaging.

For example, in the method of manufacturing the CF substrate provided by an embodiment of the present disclosure, the forming of the image sensors on the CF pixel array includes forming the image sensors on the CF pixel array by a semiconductor process.

For example, in the method of manufacturing the CF substrate provided by an embodiment of the present disclosure, the forming of the image sensors on the CF pixel array includes: forming a first protective layer at least covering the CF pixel array; and forming the image sensors on the first protective layer by a semiconductor process.

For example, the method of manufacturing the CF substrate provided by an embodiment of the present disclosure further comprises forming a second protective layer covering the CF pixel array and the image sensors.

For example, in the method of manufacturing the CF substrate provided by an embodiment of the present disclosure, the forming of the image sensors on the CF pixel array includes: providing the image sensors on a support substrate; and fixing the support substrate on the CF pixel array.

BRIEF DESCRIPTION OF THE DRAWINGS

A brief description will be given below to the accompanying drawings of the embodiments to provide a more clear understanding of the technical proposals of the embodiments of the present disclosure. Apparently, the drawings described below only involve some embodiments of the present disclosure but are not intended to limit the present disclosure.

DETAILED DESCRIPTION

In order to make objects, technical details and advantages of the embodiments of the present disclosure apparent, the technical solutions of the embodiments will be described in a clearly and completely way in connection with the drawings related to the embodiments of the disclosure. Apparently, the described embodiments are just a part but not all of the embodiments of the disclosure. Based on the described embodiments herein, one of ordinary skill in the art can obtain other embodiment(s), without any inventive work, which shall be within the scope of the disclosure.

Unless otherwise defined, all the technical and scientific terms used herein have the same meanings as commonly understood by one of ordinary skill in the art to which the present disclosure belongs. The terms, such as 'first,' 'second,' or the like, which are used in the description and the claims of the present disclosure, are not intended to indicate any sequence, amount or importance, but for distinguishing various components. The terms, such as 'comprise/comprising,' 'include/including,' or the like are intended to specify that the elements or the objects stated before these terms encompass the elements or the objects and equivalents thereof listed after these terms, but not preclude other elements or objects. The terms, 'on,' 'under,' 'left,' 'right,' or the like are only used to indicate relative position relationship, and when the absolute position of the object which is described is changed, the relative position relationship may be changed accordingly.

The figures used in the present disclosure are not drawn strictly in actual proportion. The numbers of color pixel units and array pixel units in the embodiments are not limited to the numbers shown in the drawings. The specific size and number of the structures can be determined according to actual demands. The drawings described in the present disclosure are only schematically structural views.

In some electronic products with display function, a shot lens dedicated for photographing is usually disposed in a non-display area, and this arrangement needs to reserve a certain space in the non-display area, so the area of the non-display area is often increased. The display device that completes the shooting function in the display area without arranging the shot lens in the non-display area can reduce the area of the non-display area. By design, the display device can achieve better imaging effect in the environment of sufficient light and weak light, and has simple structure, which can enhance the user experience.

At least an embodiment of the present disclosure provides a color filter (CF) substrate, which comprises a base substrate, a CF pixel array and image sensors. The CF pixel array is disposed on the base substrate and includes CF pixel units arranged in an array. The image sensors are disposed on the CF pixel array, correspond to at least part of the CF pixel units, and are configured to receive light travelling through the CF pixel units for imaging.

Figure 1A:
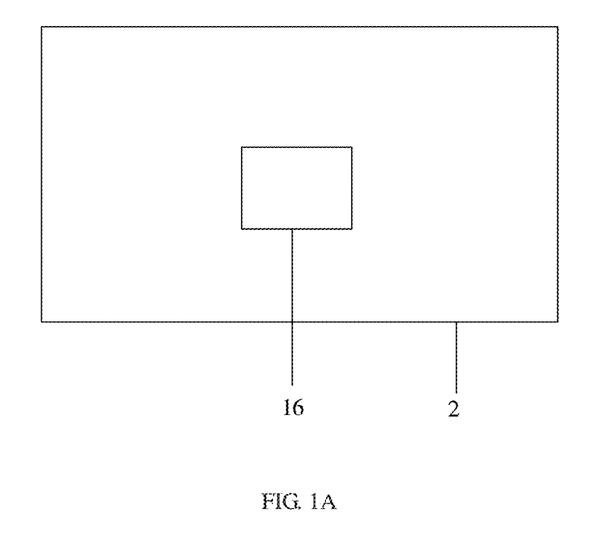
FIG. 1A is a schematic diagram of an imaging area of a color filter (CF) substrate provided by an embodiment of the present disclosure.
Figure 1B:
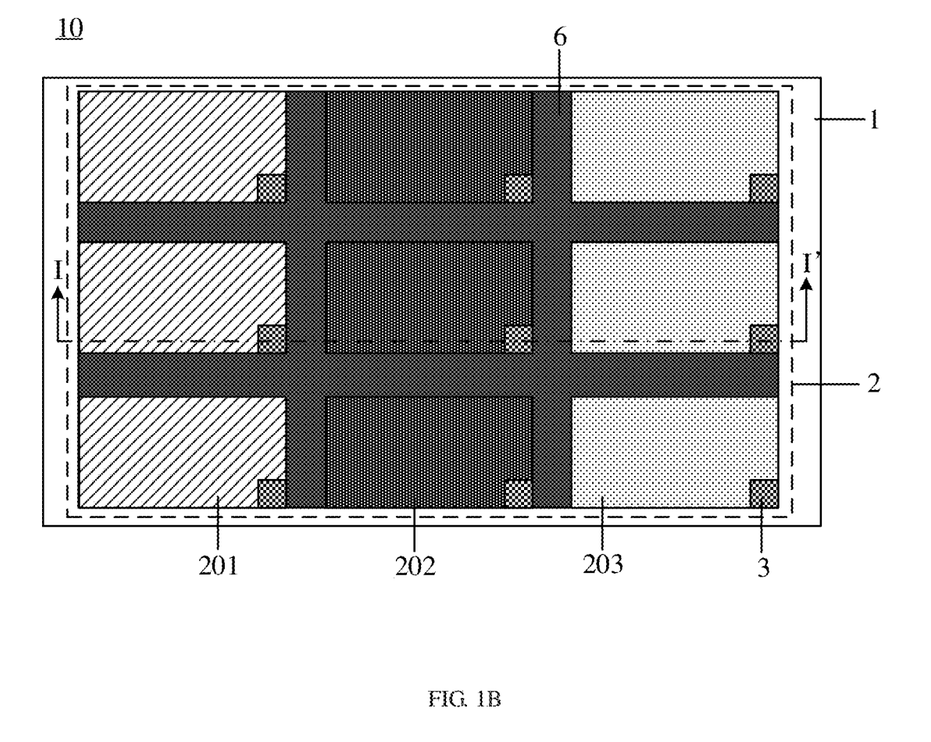
FIG. 1B is a schematic plan view of the CF substrate provided by an embodiment of the present disclosure.
Figure 2:
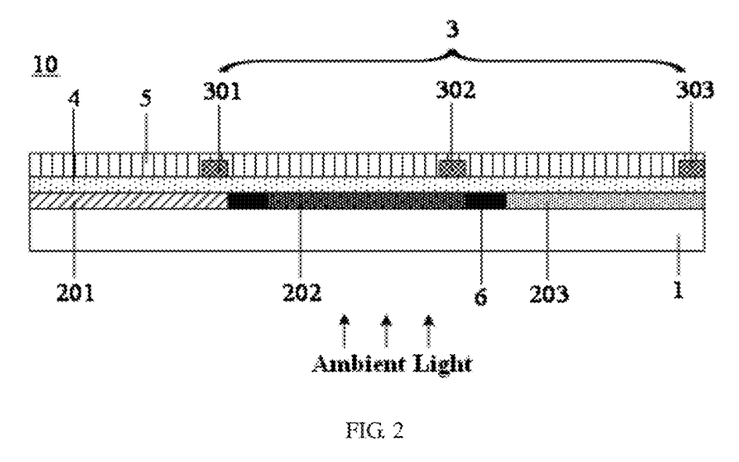
FIG. 2 is a schematically sectional view of the I-I' line in FIG. 1B.

Exemplarily, FIG. 1A is a schematic diagram of an imaging area of the CF substrate provided by an embodiment of the present disclosure. FIG. 1B is a schematic plan view of the CF substrate provided by an embodiment of the present disclosure. FIG. 2 is a schematically sectional view of the I-I' line in FIG. 1B. As shown in FIGS. 1B and 2, a CF substrate 10 comprises a base substrate 1, a CF pixel array 2 and image sensors 3. The base substrate 1, for instance, may be a glass substrate, a quartz substrate, etc. The base substrate 1, for instance, may also be a flexible substrate. In this case, for instance, the material of the base substrate 1 is polyimide (PI). The CF pixel array 2 is disposed on the base substrate 1 and includes CF pixel units (numbered as 201, 202 and 203 in FIG. 2) arranged in an array. Different colors (for instance, three primary colors red, green and blue are adopted here) can respectively transmit through these CF pixel units. The CF pixel array 2 further includes a black matrix (BM) 6 disposed among the CF pixel units. The BM 6 can prevent the crosstalk between light of adjacent CF pixel units. The image sensors 3 are disposed on the CF pixel array, may be directly formed on the CF substrate, and correspond to at least part of the CF pixel units (as shown in the figure, the image sensors 3 correspond to all the CF pixel units). As shown in the figure, the image sensor 3 is respectively disposed in each CF pixel unit in the imaging area, and is configured to receive light transmitting through the CF pixel unit for imaging. The structure as shown in FIG. 1B is only an exemplary structure. For instance, no black matrix or the like may be formed among the CF pixel units.

As shown in FIG. 1A, in the CF substrate, the image sensors may be disposed in an imaging area 16 for imaging. For instance, in the example as shown in FIG. 1A, the imaging area 16 may correspond to partial area of the CF pixel array 2 of the CF substrate. For instance, in some examples, the imaging areas 16 may also be multiple and are distributed at different areas of the CF pixel array 2. For instance, in some examples, in each imaging area 16, the image sensors 3 may also correspond to part of the CF pixel units, for instance, correspond to a plurality of alternately arranged CF pixel units. For instance, in some examples, the imaging area 16 may also correspond to the entire CF pixel array of the CF substrate to increase the photosensitive area of the image sensors and achieve better imaging effect.

Figure 1C:
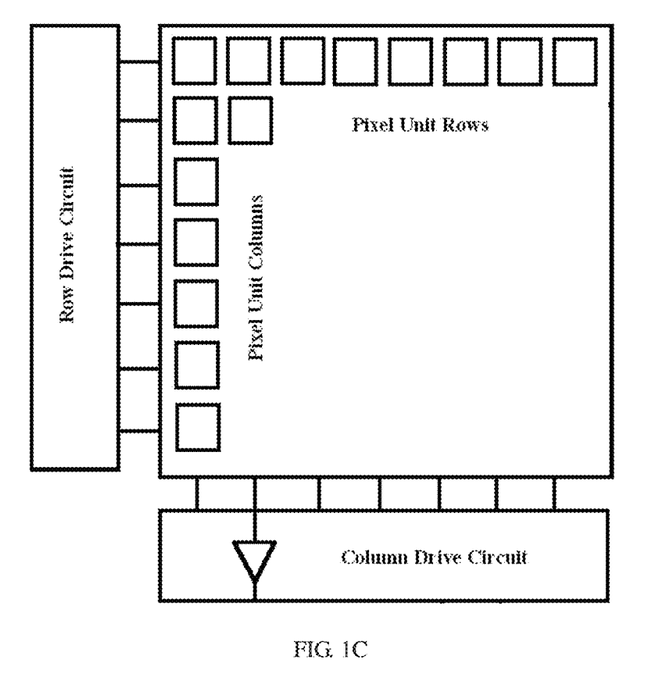
FIG. 1C is a principle block diagram of a complementary metal-oxide-semiconductor (CMOS) image sensor.

For instance, each image sensor 3 may be a CMOS image sensor or a charge-coupled device (CCD) image sensor and may be directly formed on the CF substrate by a semiconductor process. FIG. 1C is a principle block diagram of a CMOS image sensor. As shown in FIG. 1C, the CMOS image sensor includes a pixel unit array and a drive circuit. The drive circuit, for instance, includes a row drive circuit, a column drive circuit, etc. For instance, the column drive circuit may include an amplifying circuit, an analog-to-digital converter (ADC), etc. The pixel unit array includes pixel units arranged in an array. For instance, as shown in the figure, the pixel unit array is arranged in a square matrix in the X direction and Y direction. Each pixel unit in the square matrix has address in the X direction and Y direction (for instance, the row direction and the column direction) and can be respectively selected in the two directions through corresponding row line and corresponding column line. An output current/voltage signal is amplified and transmitted to an A/D convertor for analog-to-digital conversion and becomes a digital signal for output. The drive circuit can be arranged in the same base substrate as the pixel unit array, or be independently provided and electrically connected to the pixel unit array.

As shown in FIG. 2, the image sensor 3 utilizes the ambient light for imaging. The ambient light (it is normally white light) is incident into the CF pixel unit, subjected to the color filter function of the CF pixel unit, and emitted as a corresponding monochromatic light (for instance, red light, green light or blue light). Each imaging pixel unit of the image sensor 3 receives the monochromatic light travelling through the CF pixel unit corresponding to the imaging pixel unit, performs imaging processing on the received light, and obtains a data signal of a monochromatic subpixel of an acquired image, and the data signal can be transmitted to a storage unit (not shown in the figure) to stored and form a file of the entire image. In this way, the image sensors 3 can receive and process light of different colors travelling through the CF pixel units, so as to realize color imaging.

The application of the CF substrate provided by the embodiment of the present disclosure in the display panel can conveniently form an in-cell display panel having color photographing function. The display panel has a simple structure and is light and thin.

For instance, the CF pixel units include color filter plates of different colors so as to transmit different monochromatic lights, so that the image sensors 3 can utilize different chromatic lights for color imaging. For instance, the CF pixel units include red pixel units 201, green pixel units 202 and blue pixel units 203. An imaging pixel unit 301 of an image sensor corresponding to the red pixel unit 201 receives the red light travelling through the red pixel unit 201 and obtains a red subpixel of a captured image; an imaging pixel unit 302 of an image sensor corresponding to the green pixel unit 202 receives the green light travelling through the green pixel unit 202 and obtains a green subpixel of the captured image; and an imaging pixel unit 303 of an image sensor corresponding to the blue pixel unit 203 receives the blue light travelling through the blue pixel unit 203 and obtains a blue subpixel of a captured image. As shown in the figure, the imaging pixel units 301, 302 and 303 of the image sensors respectively sense the received red light, green light, and blue light, and convert the optical signals into electrical signals. These electrical signals are converted into image signals which are outputted and stored to realize color imaging.

As described above, the image sensors include imaging pixel units, and the imaging pixel units may be in one-to-one correspondence with the CF pixel units. For instance, each imaging pixel unit of the image sensors may include an active pixel sensing circuit, and the active pixel sensing circuit, for instance, may have a 3T1C structure including 3 transistors, a 4T1C structure including 4 transistors or the like, which may refer to related technique. For instance, in an example, each imaging pixel unit may include a photodiode and a switching transistor electrically connected with the photodiode; the photodiode can convert an optical signal irradiated thereon into an electrical signal; and the switching transistor can control whether to read the electrical signal obtained by acquisition of the optical signal on the photodiode. For instance, the photodiode is a photosensitive diode. The specific structure of the imaging pixel unit of the image sensor may refer to the conventional technique in the art, for instance, it may adopt an appropriate type (e.g., CMOS type, or CCD type). No limitation will be given here in the embodiment of the present disclosure. The one-to-one correspondence of the imaging pixel units of the image sensors and the CF pixel units can increase the photosensitive area of the image sensors, the image sensors can acquire richer optical signals, can achieve good imaging effect even when the ambient light is insufficient (for instance, dark-light photographing is performed), and it can avoid problems of image blurring, increased amount of noisy points, insufficient detail and the like, namely obtaining good photographing or shooting effect.

For instance, in an example, the CF substrate 10 further comprises a first protective layer 4, and the first protective layer 4 at least covers the CF pixel array 2. The first protective layer 4 may also cover a part of the base substrate 1 not provided with the CF pixel array 2. The image sensors 3 are disposed on the first protective layer 4. The first protective layer 4 can protect the CF pixel array of the CF substrate and can act as a planarization layer. For instance, in the process of manufacturing the CF substrate 2, when the image sensors 3 are formed on the CF pixel array 2, in the process of forming the image sensors, the first protective layer 4 can avoid or reduce the adverse effects on the CF pixel array, e.g., the pollution caused by impurity ions, foreign matter, etc.

For instance, the material of the first protective layer 4 may be a transparent inorganic material. For instance, the first protective layer 4 is a single-layer or multi-layer structure including silicon nitride, silicon oxide, or silicon oxynitride. For instance, the first protective layer 4 is a stack layer structure including silicon nitride and silicon oxide.

For instance, in an example, the CF substrate 10 further comprises a second protective layer 5, and the second protective layer 5 covers the CF pixel array 2 and the image sensors 3 disposed on the CF pixel array 2. The second protective layer 5 can prevent the image sensors from damaging and the pollution caused by, for instance, impurity ions, foreign matter and the like. For instance, a surface of the second protective layer 5 away from the base substrate 1 is a flat surface, so that the second protective layer 5 can simultaneously act as a planarization layer, which is favorable for forming a display device. In addition, when the CF substrate 10 is applied to a liquid crystal display (LCD) panel, the second protective layer 5 can also be configured to be a liquid crystal alignment layer. For instance, the second protective layer 5 may be made from material (e.g., PI) for forming the alignment layer. In this way, no liquid crystal alignment layer is required to be independently arranged, so the structure of the LCD panel can be simplified, and the LCD panel can be lighter and thinner.

For instance, the material of the second protective layer 5 may be organic material, such as resin material. The resin material, for instance, may be polyimide (PI), epoxy resin, or polyacrylic resin, etc. The material of the second protective layer 5 is not limited to the above type. No limitation will be given here in the embodiment of the present disclosure.

Figure 3:
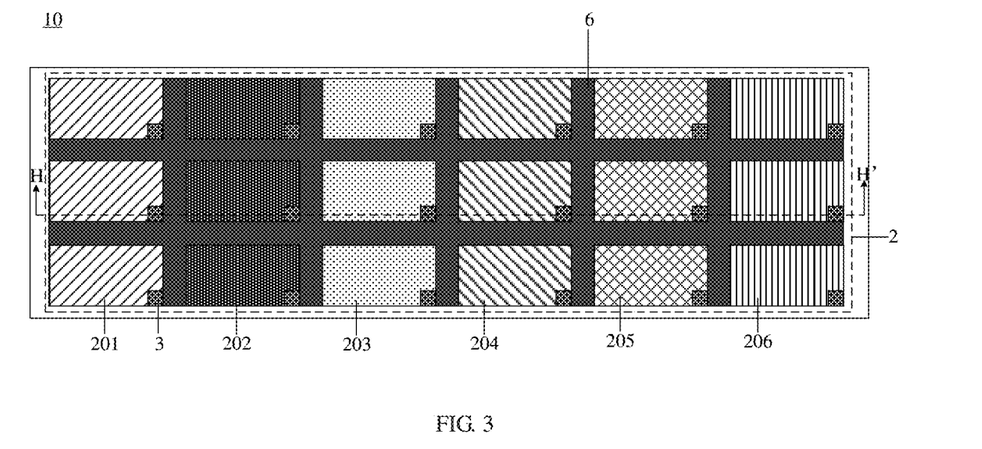
FIG. 3 is a schematic plan view of another CF substrate provided by an embodiment of the present disclosure.
Figure 4A:
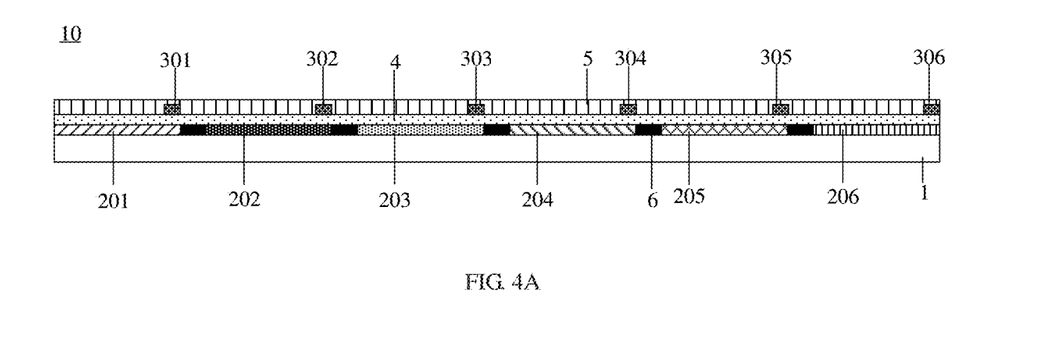
FIG. 4A is a schematic sectional view of the H-H' line in FIG. 3.

For instance, FIG. 3 is a schematic plan view of another CF substrate provided by an embodiment of the present disclosure, and FIG. 4A is a schematically sectional view of the H-H' line in FIG. 3. The difference between the embodiment as shown in FIGS. 3 and 4A and the embodiment as shown in FIGS. 1B and 2 is that: in the CF substrate 10 as shown in FIGS. 3 and 4A, the CF substrate as shown in FIG. 4A comprises CF pixel units of six colors, namely red (R), green (G), blue (B), yellow (Y), cyan (C), and magenta (M), and image sensors for processing lights of these six colors. The CF pixel units include red pixel units 201, green pixel units 202, blue pixel units 203, yellow pixel units 204, cyan pixel units 205, and magenta pixel units 206. An imaging pixel unit 301 of the image sensor corresponding to the red pixel unit 201 receives red light travelling through the red pixel unit 201; an imaging pixel unit 302 of the image sensor corresponding to the green pixel unit 202 receives green light travelling through the green pixel unit 202; an imaging pixel unit 303 of the image sensor corresponding to the blue pixel unit 203 receives blue light travelling through the blue pixel unit 203; an imaging pixel unit 304 of the image sensor corresponding to the yellow pixel unit 204 receives yellow light travelling through the yellow pixel unit 204; an imaging pixel unit 305 of the image sensor corresponding to the cyan pixel unit 205 receives cyan light travelling through the cyan pixel unit 205; and an imaging pixel unit 306 of the image sensor corresponding to the magenta pixel unit 206 receives magenta light travelling through the magenta pixel unit 206. The imaging pixel units 301, 302, 303, 304, 305 and 306 of the image sensors sense the red light, the green light, the blue light, the yellow light, the cyan light, and the magenta light respectively, and convert optical signals into electrical signals, and these electrical signals are converted into image signals, which are outputted and stored to realize color imaging.

Figure 4B:
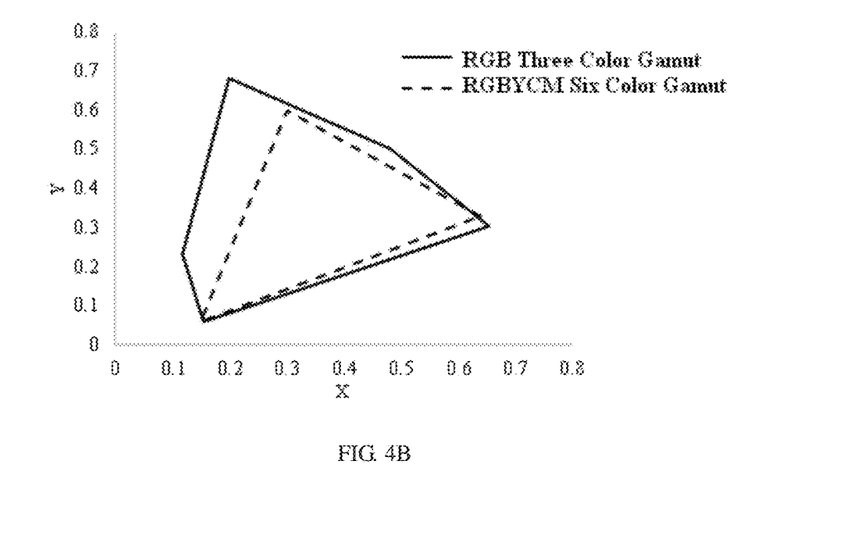
FIG. 4B is a color gamut comparison chart of the CF substrate as shown in FIG. 2 and the CF substrate as shown in FIG. 4A.

FIG. 4B is a color gamut comparison chart of the CF substrate as shown in FIG. 2 and the CF substrate as shown in FIG. 4A. As can be seen from FIG. 4B, compared with the color gamut obtained by using three colors, namely red, green, and blue, as the primary colors of image recording, the color gamut obtained by using six colors, namely red, green, blue, yellow, cyan, and magenta, as the primary colors of image recording has larger range.

Compared with the CF substrate as shown in FIG. 2, the CF substrate as shown in FIG. 4A is applied in a display panel or a display device and can achieve a wider color gamut. Moreover, by adoption of the six colors as the primary colors of image recording, the color balance of the captured image is better; the image quality is more comfortable; and the image to be captured can be recorded more realistically. Other features of the CF substrate as shown in FIG. 4A are all the same as those as shown in FIG. 2, they may refer to the above description, and will not be repeated here.

Figure 5:
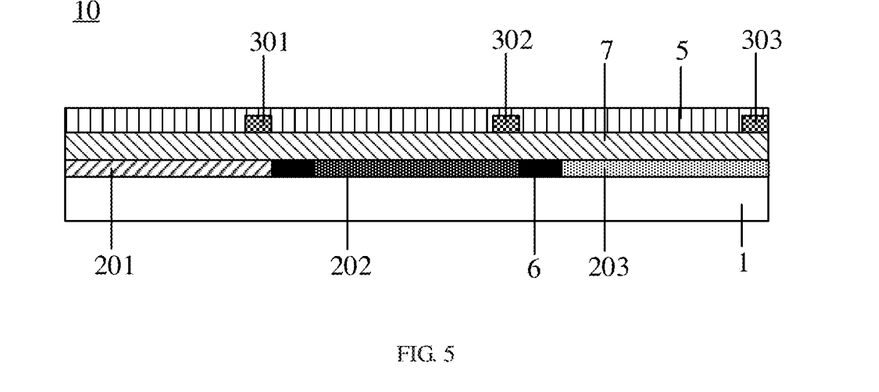
FIG. 5 is another schematically sectional view of the I-I' line in FIG. 1B.
Figure 6:
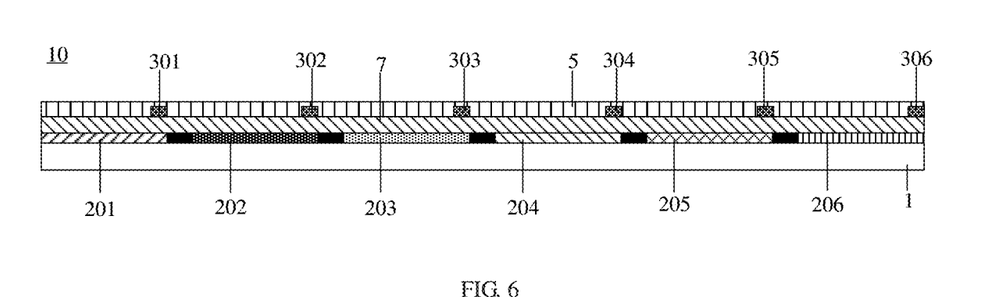
FIG. 6 is another schematically sectional view of the H-H' line in FIG. 3.

FIG. 5 is another schematically sectional view of the I-I' line in FIG. 1B, and FIG. 6 is another schematically sectional view of the H-H' in FIG. 3. In the embodiment as shown in FIGS. 5 and 6, the CF substrate 10 may further comprise a support substrate 7; the image sensor 3 is disposed or formed on the support substrate 7; and the support substrate 7 is fixed on the CF pixel array 2. For instance, the support substrate 7 can be bonded to the CF pixel array 2, so as to fix the image sensors 3 on the base substrate 1. The technical effect of the embodiment is similar to that in the embodiments as shown in FIGS. 1B and 3, so no further description will be repeated here.

In other embodiments of the present disclosure, the required structure can be further formed on the basis of FIGS. 1B and 3, for instance, a common electrode layer is formed. The common electrode layer, for instance, may be formed on a surface of the second protective layer 5 (in this case, the second protective layer cannot be an alignment layer at the same time). The common electrode layer, for instance, is a common electrode layer of a vertical electric field type liquid crystal display (LCD) panel.

At least one embodiment of the present disclosure also provides a display panel, which comprises any CF substrate provided by the embodiments of the present disclosure. The display panel provided by the embodiment of the present disclosure can use the image sensors in the display area to realize color image photographing. The display panel is light and thin, has a simple structure, is easy to manufacture, and no additional shot lens is to be arranged.

Figure 7:
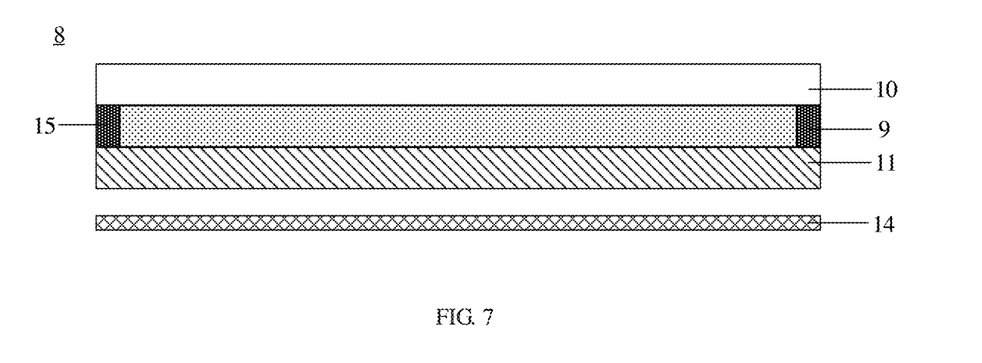
FIG. 7 is a schematic diagram of a display panel provided by an embodiment of the present disclosure.

Exemplarily, FIG. 7 is a schematic diagram of a display panel provided by an embodiment of the present disclosure. As shown in FIG. 7, a display panel 8 comprises any of the CF substrates 10 provided by the embodiments of the present disclosure. No limitation will be given to other structures of the display panel 8 in the embodiments of the present disclosure. For instance, in the example as shown in FIG. 7, the display panel 8 may further comprise a backlight 14 which is configured to provide a light source for display. For instance, the backlight may be a direct-lit light source as shown in FIG. 7. In other embodiments of the present disclosure, the backlight may be a side-lit light source. No limitation will be given to the type of the backlight in the embodiments of the present disclosure. In the case of requiring the backlight, for instance, the display panel may be an LCD panel. An array substrate 11 is cell-assembled with the CF substrate 10; a liquid crystal layer 9 is disposed between the array substrate 11 and the CF substrate 10; and the array substrate 11 and the CF substrate 10 are combined through sealant 15 at the periphery of the display panel 8, and the liquid crystal layer 9 is sealed.

Figure 8A:
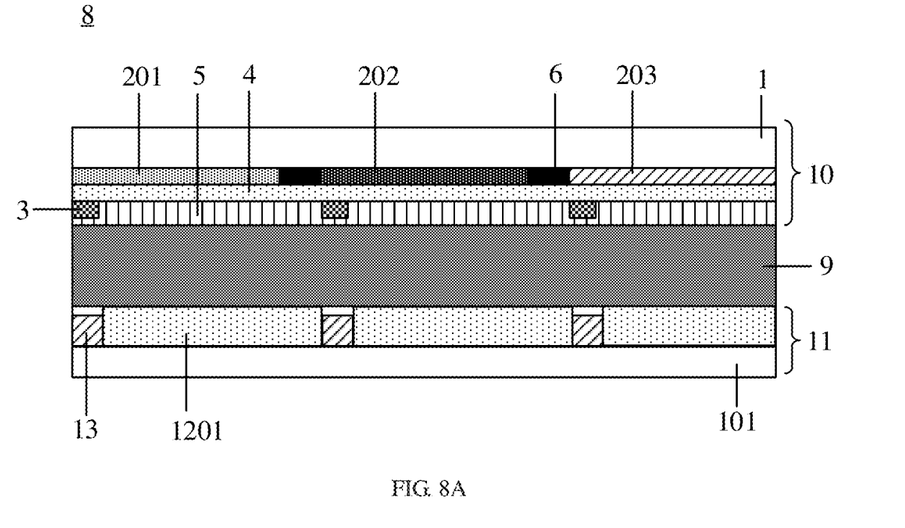
FIG. 8A is a schematically sectional view of a display panel provided by an embodiment of the present disclosure.

FIG. 8A is a schematically sectional view of a display panel provided by an embodiment of the present disclosure, for instance, the display panel comprises the CF substrate as shown in FIG. 2. As shown in FIG. 8A, the display panel 8 further comprises an array substrate 11, and the array substrate 11 and the CF substrate 10 are cell-assembled and combined and sealed by sealant (not shown in FIG. 8A) on the circumference. The image sensors 3 are disposed between the base substrate 1 of the CF substrate 10 and the array substrate 11, namely the image sensors 3 are disposed in the cell of the display panel 8. The display panel 8 is an in-cell type, it can realize color photographing, and has a simple, light and thin structure, which is easy to be manufactured. For instance, the display panel 8 may be an LCD panel. At this point, the display panel 8 comprises a liquid crystal layer 9 which is filled between the array substrate 11 and the CF substrate 10. For instance, the LCD panel further comprises a backlight so as to provide a light source for display. A display drive circuit of the display panel, for instance, may be disposed on a flexible printed circuit board (FPC) and electrically connected with gate lines and data lines in the display pixel array through a bonding area. Correspondingly, drive circuit(s) of the image sensors 3 may also be disposed on the FPC and electrically connected with row lines and column lines in the imaging pixel array through the bonding area. No limitation will be given to the supply mode of the drive circuit in the embodiments of the present disclosure.

Figure 8B:
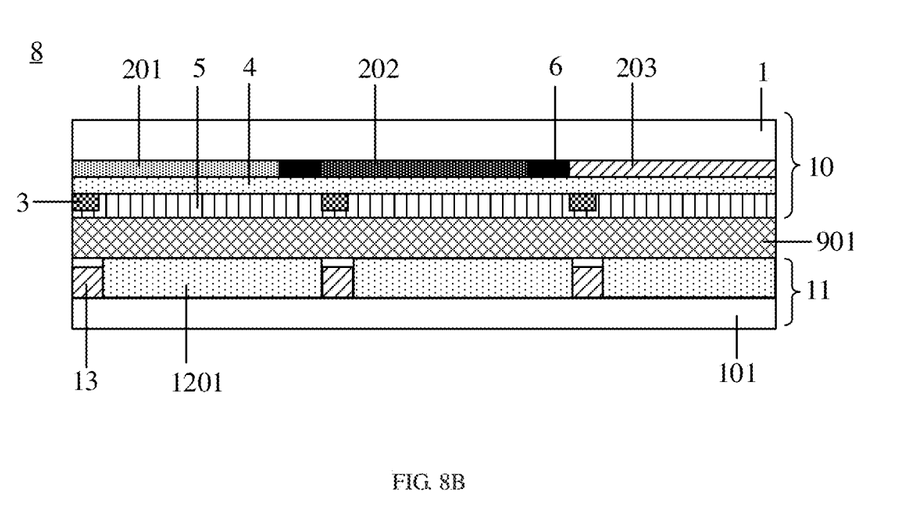
FIG. 8B is a schematically sectional view of another display panel provided by an embodiment of the present disclosure.

FIG. 8B is a schematically sectional view of another display panel provided by an embodiment of the present disclosure. As shown in FIG. 8B, for instance, the display panel 8 may also be an organic light-emitting diode (OLED) display device, for instance, a white light organic light-emitting diode (W-OLED) display device. In this case, the display panel 8 comprises a light-emitting element layer 901. For instance, the organic light-emitting element layer 901 includes a light-emitting diode, a pixel definition layer (PDL) and other structures. The OLEDs are driven by the pixel drive circuit in the array substrate. The OLED includes a cathode, an emission layer (EML), and an anode, etc.

Figure 9:
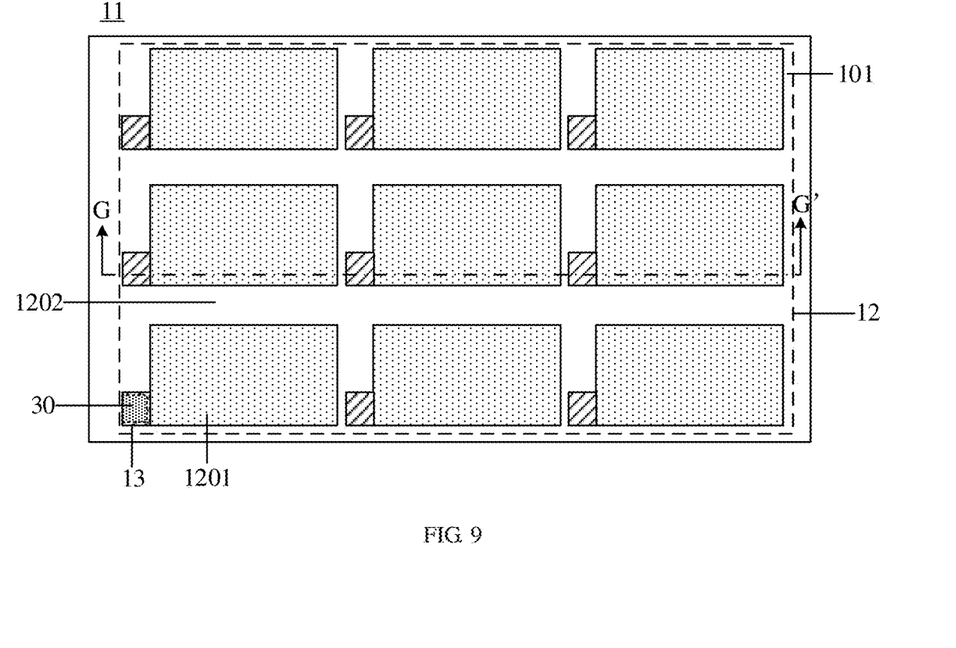
FIG. 9 is a schematic plan view of an array substrate of the display panel provided by an embodiment of the present disclosure.

FIG. 9 is a schematic plan view of an array substrate provided by an embodiment of the present disclosure. As shown in FIG. 9, for instance, the array substrate 11 of the display panel 8 comprises a driving pixel array 12. The driving pixel array 12 corresponds to the CF pixel array 2 of the CF substrate 10. For instance, the driving pixel array 12 includes open areas 1201 for display and a non-display area 1202 among the open areas. The plurality of open areas 1201 of the driving pixel array respectively correspond to the CF pixel units 201/202/203, namely orthographic projections of the CF pixel units 201/202/203 on the driving pixel array 12 are at least partially coincident with the open areas of the driving pixel array. Orthographic projections 30 of the image sensors on the driving pixel array are disposed in the non-display area 1202 of the driving pixel array. In this way, the image sensors 3 will not affect the aperture ratio of the display panel 8, which is favorable to improve the light efficiency of the display panel.

For instance, the array substrate 11 includes a TFT 13 in the non-display area. The TFT is a switching transistor for displaying a pixel unit (e.g., an LCD device or an OLED display device) or a driving transistor (e.g., an OLED display device). The image sensors 3 and the TFTs 13 are at least partially overlapped in the direction perpendicular to the array substrate 11. In this way, the image sensors 3 will not affect the aperture ratio of the display panel 8. Moreover, these TFTs also provide light-shielding effect for the image sensors 3 and reduce the adverse effect of ambient light (e.g., backlight) on the image sensors 3. As shown in FIG. 9, for instance, the orthographic projection of each image sensor on the driving pixel array 12 is overlapped with part of the corresponding TFT 13. In other embodiments of the present disclosure, the orthographic projection of the image sensor on the driving pixel array 12 may also be overlapped with the entire corresponding TFT 13.

For instance, the display panel further comprises a display drive circuit. For instance, the display drive circuit includes signal lines and the like, for instance, a plurality of display gate lines and display data lines connected to the driving pixel array 12 of the array substrate 11, so as to provide scanning signals and data signals to the driving pixel units of the driving pixel array 12 for display. The display panel may further comprise a row driving circuit, a column driving circuit and the like for the image sensors. For instance, the row driving circuit of the image sensor includes a plurality of imaging gate lines respectively connected to the display panel and connected with the image sensors, and the column driving circuit of the image sensors includes a plurality of imaging data lines respectively connected to the display panel and connected with the image sensors, so as to provide scanning signals for imaging pixels of the image sensors and read image signals from the imaging pixels of the image sensors for imaging. The display drive circuit and the row driving circuit and the column driving circuit of the image sensors may refer to the conventional design in the art. For instance, the row driving circuit, the column driving circuit and the like can be integrated into the same image control circuit or chip. No limitation will be given here in the embodiments of the present disclosure.

At least one embodiment of the present disclosure also provides a method of manufacturing a CF substrate. The method comprises: providing a base substrate; forming a CF pixel array on the base substrate, in which the CF pixel array includes CF pixel units arranged in an array; and forming image sensors on the CF pixel array, in which the image sensors correspond to the CF pixel units and are configured to receive light travelling through the CF pixel units for imaging.

As an example, description will be given below to the method of manufacturing the CF substrate in which the CF substrate comprises CF pixel units of red, green, and blue.

Figure 10A:
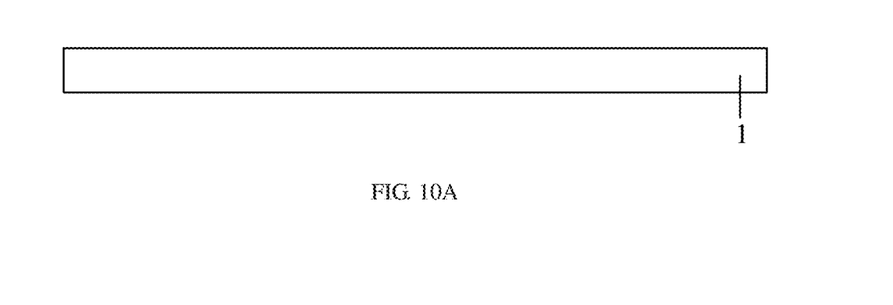
FIGS. 10A-10E are schematic diagrams of a method of manufacturing a CF substrate, provided by an embodiment of the present disclosure.

FIGS. 10A-10E are schematic diagrams of the method of manufacturing the CF substrate provided by an embodiment of the present disclosure. As shown in FIG. 10A, firstly, a base substrate 1 is provided, for instance, the base substrate 1 can be cleaned or subjected to other processing. The base substrate 1, for instance, may be a glass substrate, a quartz substrate, etc. The base substrate 1, for instance, may be a flexible substrate. In this case, for instance, the material of the base substrate 1 is PI.

Figure 10B:
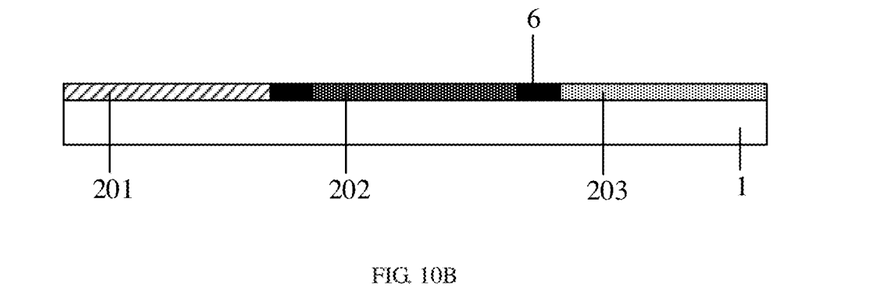

As shown in FIG. 10B, the CF pixel array 12 is formed on the base substrate 1. The CF pixel array 12 includes CF pixel units 201/202/203 arranged in an array. For instance, red pixel units 201, green pixel units 202, and blue pixel units 203 may be sequentially formed by color resins via three patterning processes, for instance, photolithographic processes. For instance, the forming of the CF pixel array 12 further includes forming black matrix (BM) 6 among the CF pixel units on the base substrate 1. For instance, before or after forming the CF pixel units 201/202/203, the BM 6 is formed by black resin via a patterning process, such as a photolithography process.

The method of manufacturing the CF substrate further comprises forming image sensors on the CF pixel array. The image sensors correspond to the CF pixel units respectively and can receive light travelling through the CF pixel units for imaging. For instance, the forming of the image sensors on the CF pixel array includes forming the image sensors on the CF pixel array by a semiconductor process.

Figure 10C:
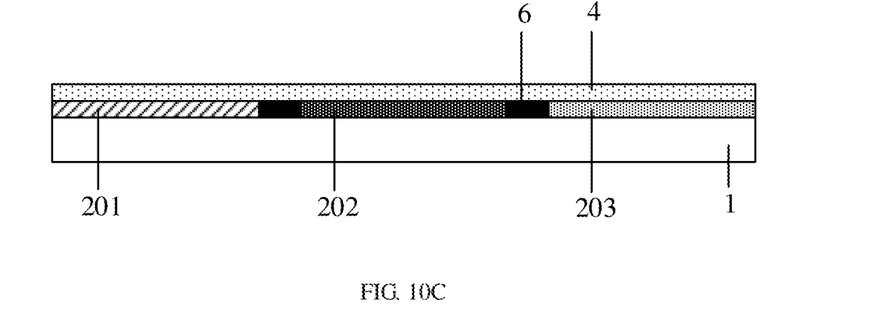

As shown in FIG. 10C, the forming of the image sensors on the CF pixel array includes: forming a first protective layer 4 covering the CF pixel array. The first protective layer 4 is formed before forming the image sensors. In the subsequent process of forming the image sensors, the image sensors may be formed on the first protective layer 4, so that the first protective layer 4 can prevent the CF pixel array from being contaminated. For instance, the material of the first protective layer 4 is a transparent material. For instance, the transparent material includes at least one of silicon nitride, silicon oxide, or silicon oxynitride. For instance, the first protective layer is formed to be a single-layer structure including silicon nitride, silicon oxide, or silicon oxynitride, or formed to be a layer stack structure including silicon nitride and silicon oxide. For instance, the first protective layer 4 may be formed by chemical vapor deposition or magnetron sputtering. Subsequently, the first protective layer 4 may be subjected to a planarization process, for instance, a chemical-mechanical polishing process, to obtain a flat surface, which is favorable for the forming of the image sensors subsequently.

Figure 10D:
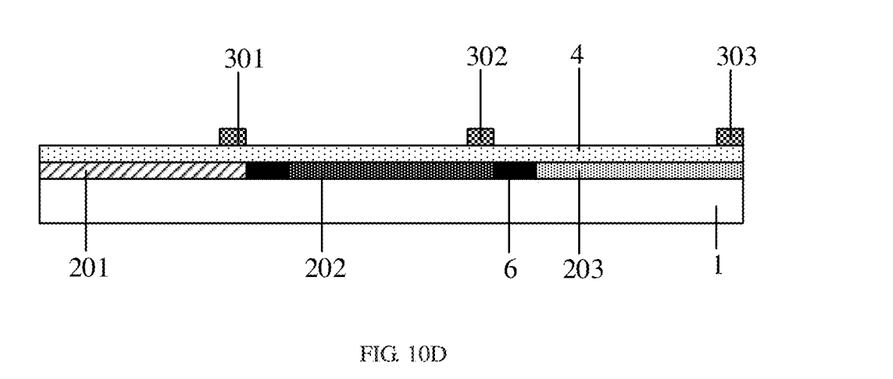

As shown in FIG. 10D, the forming of the image sensors on the CF pixel array further includes: forming the image sensors on the first protective layer 4 by a semiconductor process. The specific semiconductor process may refer to the conventional technique in the art, and is correspondingly changed according to the specific type (e.g., CMOS type, or CCD type) of the image sensors. The red pixel unit 201, the green pixel unit 202 and the blue pixel unit 203 respectively correspond to the imaging pixel unit 301 of the image sensor, the imaging pixel unit 302 of the image sensor, and the imaging pixel unit 303 of the image sensor. The imaging pixel unit 301 of the image sensor receives red light travelling through the red pixel unit 201; the imaging pixel unit 302 of the image sensor receives green light travelling through the green pixel unit 202; and the imaging pixel unit 303 of the image sensor receives blue light travelling through the blue pixel unit 203. The imaging pixel unit 301 of the image sensor, the imaging pixel unit 302 of the image sensor, and the imaging pixel unit 303 of the image sensor can respectively sense the received red light, green light and blue light, and convert optical signals into electrical signals. These electrical signals are converted into image signals which are outputted and stored to realize color imaging.

Figure 10E:
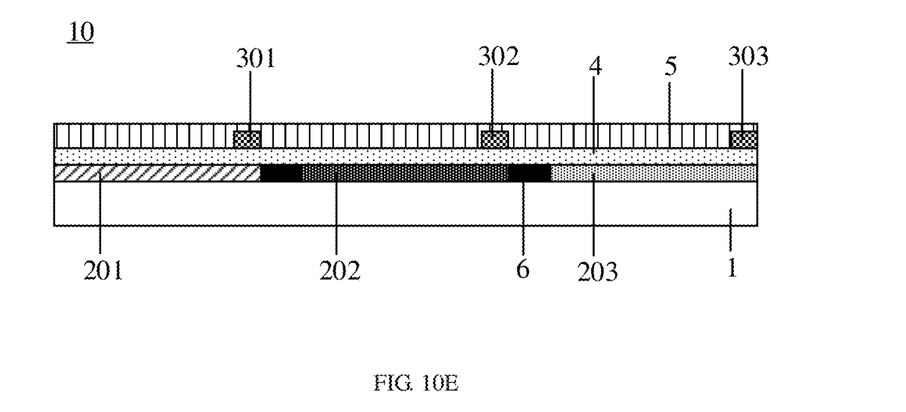

As shown in FIG. 10E, the method of manufacturing the CF substrate further comprises: forming a second protective layer 5 covering the CF pixel array and the image sensors. The second protective layer 5 can protect the image sensors from being damaged and contaminated. For instance, the material of the second protective layer 5 may be organic material, such as resin material. The resin material, for instance, may be PI, epoxy resin or polyacrylic resin. The material of the second protective layer 5 may be material not limited to the transparent material of the above types. No limitation will be given here in the embodiments of the present disclosure. For instance, the second protective layer 5 may be formed by coating. In this way, the CF substrate 10 is formed.

Figure 10F:
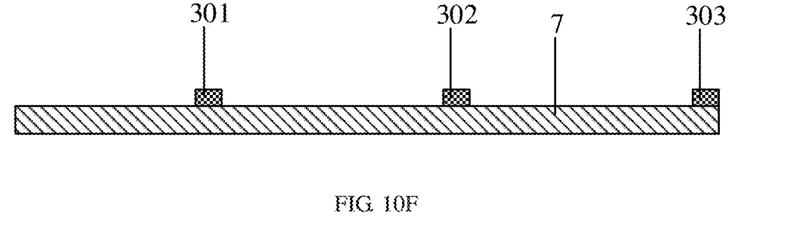
FIGS. 10F-10H are schematic diagrams of another method of manufacturing a CF substrate, provided by an embodiment of the present disclosure.
Figure 10G:
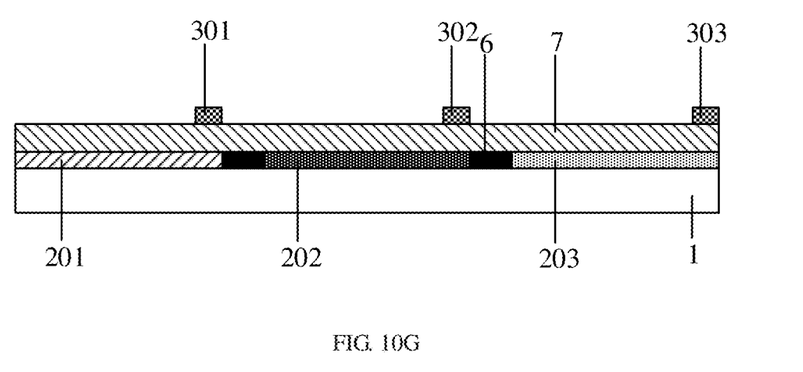
Figure 10H:
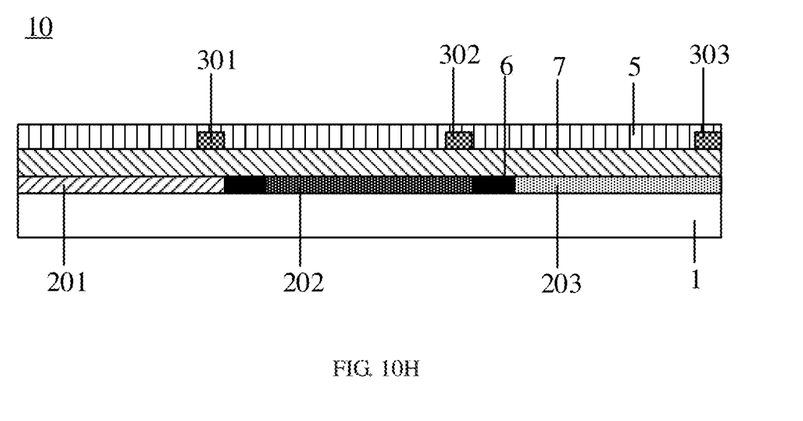

FIGS. 10F-10H are schematic diagrams of another method of manufacturing a CF substrate provided by an embodiment of the present disclosure. For instance, the forming of the image sensors on the CF pixel array may further include providing the image sensors disposed on a support substrate; and fixing the support substrate on the CF pixel array.

As shown in FIG. 10F, for instance, after the structure as shown in FIG. 10B is formed, a support substrate 7 is provided, and the image sensors are formed on the support substrate 7 by a semiconductor process. The image sensors include imaging pixel units 301/302/303 of the image sensors. For instance, the forming of the imaging pixel unit of each image sensor includes forming a photodiode and a switching transistor electrically connected with the photodiode. The photodiode can convert optical signals irradiated thereon into electrical signals. The switching transistor can control whether to read the electrical signals obtained by acquisition of the optical signals on the photodiode. For instance, the forming of the imaging pixel unit of each image sensor further includes forming an active pixel sensing circuit. The active pixel sensing circuit, for instance, may be a 3T1C structure including 3 transistors or a 4T1C structure including 4 transistors. The specific process of forming the image sensors may refer to relevant technique. The image sensors may be formed on the support substrate 7 at first, and then the structure as shown in FIG. 10B is formed. No limitation will be given to the sequence of the steps in the embodiments of the present disclosure.

As shown in FIG. 10G, the support substrate 7 is fixed on the CF pixel array as shown in FIG. 10B. For instance, the support substrate 7 is bonded to the CF pixel array, so that the red pixel unit 201, the green pixel unit 202, and the blue pixel unit 203 can respectively correspond to the imaging pixel units 301, 302 and 303 of the image sensors.

As shown in FIG. 10H, the second protective layer 5 covering the CF pixel array and the image sensors is formed, and then the CF substrate 10 is formed. The process of forming the second protective layer 5 is the same as the process as shown in FIG. 10E and can refer to the previous description.

Description is given to the above method of manufacturing the CF substrate in which the CF substrate comprises red, green, and blue CF pixel units as an example, but the method is also applicable to manufacture a CF substrate including other multiple CF pixel units. In the method of manufacturing the CF substrate provided by the embodiments of the present disclosure, different technical features may be combined.

Figure 11A:
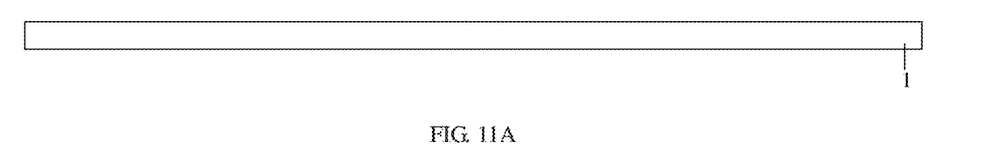
FIGS. 11A-11E are schematic diagrams of another method of manufacturing a CF substrate, provided by an embodiment of the present disclosure.

For instance, FIGS. 11A-11E are schematic diagrams of another method of manufacturing a CF substrate provided by an embodiment of the present disclosure. As shown in FIG. 11A, a base substrate 1 is provided, which is the same as that shown in FIG. 10A.

Figure 11B:
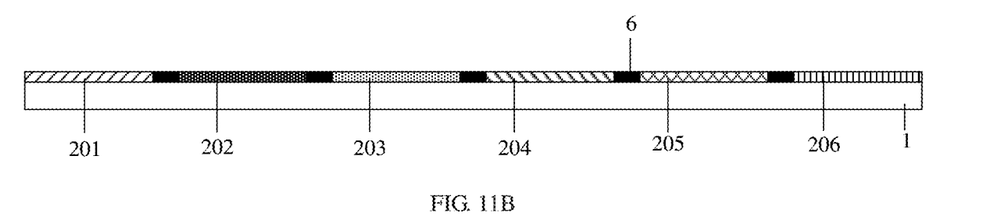

As shown in FIG. 11B, the difference between the process and the process as shown in FIG. 10B is that the formed CF pixel array includes CF pixel units of six colors, which are respectively: red pixel units 201, green pixel units 202, blue pixel units 203, yellow pixel units 204, cyan pixel units 205, and magenta pixel units 206. Other features are all the same as those shown in FIG. 10B and can refer to the previous description.

Figure 11C:
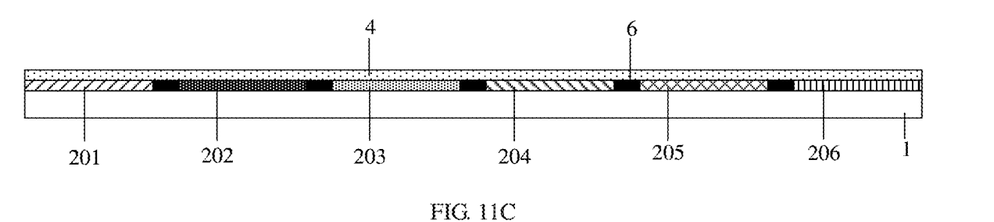

As shown in FIG. 11C, a first protective layer 4 is formed, and the process is the same as that shown in FIG. 10C.

Figure 11D:
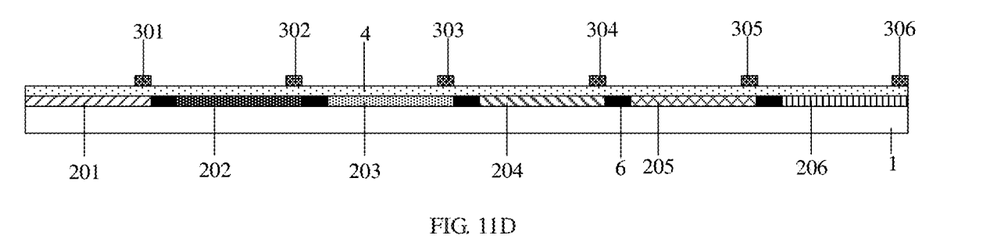

As shown in FIG. 11D, the difference between the process and FIG. 10D is that imaging pixel units 301, 302, 303, 304, 305, and 306 of the image sensors, respectively corresponding to the red pixel unit 201, the green pixel unit 202, the blue pixel unit 203, the yellow pixel unit 204, the cyan pixel unit 205, and the magenta pixel unit 206, are formed.

Figure 11E:
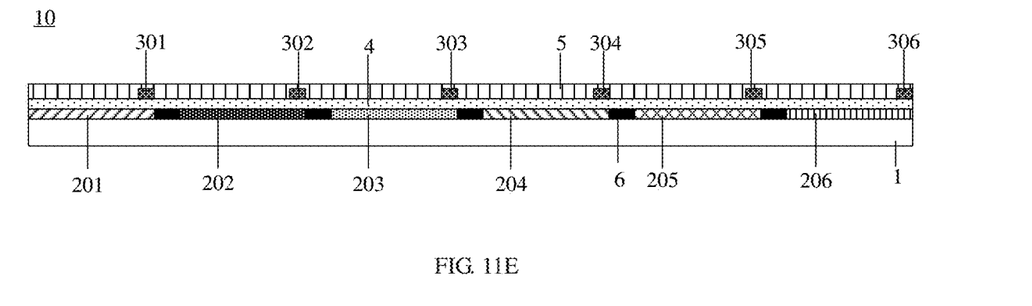

As shown in FIG. 11E, a second protective layer 5 covering the CF pixel array and the image sensors are formed, and then the CF substrate 10 is formed. The process of forming the second protective layer 5 is the same as that shown in FIG. 10E and can refer to the previous description.

Figure 12:
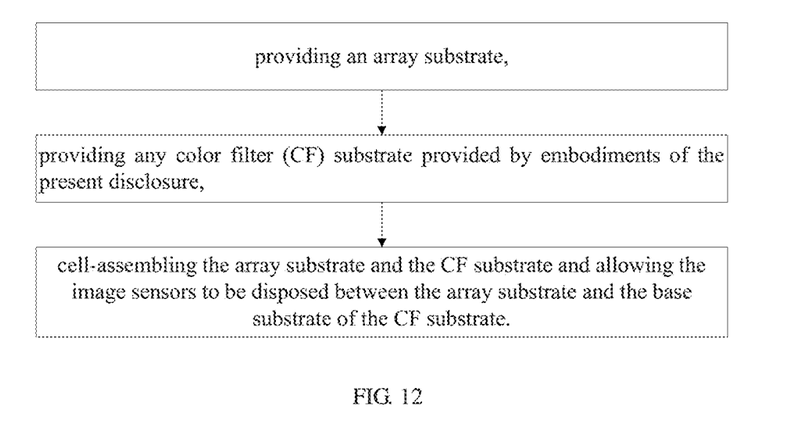
FIG. 12 is a flowchart of a method of manufacturing a display panel, provided by an embodiment of the present disclosure.

At least an embodiment of the present disclosure also provides a method of manufacturing a display panel. FIG. 12 is a flowchart of the method of manufacturing the display panel provided by an embodiment of the present disclosure. As shown in FIG. 12, the method comprises: providing an array substrate; providing the CF substrate obtained by any manufacturing method provided by the embodiments of the present disclosure; and cell-assembling the array substrate and the CF substrate and allowing the image sensors to be disposed between the array substrate and the base substrate of the CF substrate. The display panel manufactured by the method adopts in-cell type and can realize color photography. Moreover, the manufacturing method of the display panel is simple.

For instance, the display panel may be a liquid crystal display (LCD) panel. The manufacturing method of the display panel further comprises forming a liquid crystal layer by injecting liquid crystals between the array substrate and the CF substrate. For instance, the display panel may also be an OLED display device, for instance, a W-OLED display device. In this case, the manufacturing method of the display panel further comprises forming a pixel definition layer (PDL), organic light-emitting diodes OLEDs, and the like on the array substrate.

At least one embodiment of the present disclosure further provides a display device, which comprises any display panel provided by the embodiments of the present disclosure.

Figure 13:
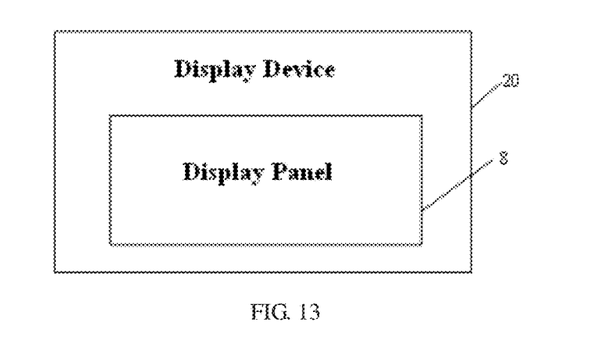
FIG. 13 is a schematic diagram of a display device provided by an embodiment of the present disclosure.

Exemplarily, FIG. 13 is a schematic diagram of the display device provided by an embodiment of the present disclosure. As shown in FIG. 13, the display device 20 comprises any display panel 8 provided by the embodiments of the present disclosure. For instance, the display device may be an LCD device, a W-OLED display device, etc.

For instance, the display device may be implemented as the following product: any product or component having display function, such as a mobile phone, a tablet PC, a TV, a display, a notebook computer, a digital photo frame, a navigator or an electronic advertisement screen.

FIG. 13 is a schematic diagram of a display device comprising any display panel provided by the embodiment of the present disclosure. Other structures of the display device are not shown and those skilled in the art may refer to the conventional technique. No limitation will be given here in the embodiment.

The display device provided by the embodiments of the present disclosure can realize color image photographing in the display area, and it is light and thin. It has a simple structure, is easy to be manufactured, and no any shot lens is needed to be additionally arranged.

At least one embodiment of the present disclosure further provides a method of manufacturing a display device. The display device is the display device provided by the embodiments of the present disclosure and comprises the image sensors disposed on the CF substrate. The method comprises: executing a photographing operation by using the image sensors during the non-display operation of the display device. For instance, the display device further comprises a controller. For instance, the controller can control the operation of the image sensors. Meanwhile, for instance, the controller can also control the display operation by controlling the display drive circuit, so as to break the display function in the process of executing the photographing operation, and restore the display function after the photographing operation. The controller, for instance, is a central processing unit (CPU), a digital signal processor (DSP), a programmable logical controller (PLC), etc.

For instance, in the operation method of the display device provided by an embodiment of the present disclosure, when the display device comprises the backlight, for instance, the display device is an LCD panel. The operation method further comprises: turning off the backlight during the photographing operation. For instance, the controller may be adopted to control the 'on' and 'off' of the backlight, so as to turn off the backlight in the process of executing the photographing operation and prevent backlight from affecting imaging, and the image sensors utilize ambient light for imaging to complete photographing; and the backlight is turned on after photographing, and the display function is restored.

The foregoing is only the exemplary embodiments of the present disclosure and not intended to limit the scope of the present disclosure. The scope of the present disclosure should be defined by the appended claims.

What is claimed is:

1. A display device, comprising a display panel, wherein the display panel comprises:
    a color filter (CF) substrate and an array substrate opposite to and assembled with the CF substrate, wherein the CF substrate comprises:
    a first base substrate;
    a CF pixel array provided on the first base substrate and including CF pixel units in an array;
    image sensors on the CF pixel array, the image sensors are provided to correspond to at least part of CF pixel units, and configured to receive light travelling through the CF pixel units for imaging;
    wherein the array substrate comprises a second base substrate, a driving pixel array on the second base substrate corresponding to the CF pixel array of the CF substrate, the driving pixel array comprises open areas for display, and non-display areas among the open areas, the open areas of the driving pixel array respectively correspond to the CF pixel units, and orthographic projections of the image sensors on the second base substrate are fall within the non-display areas of the driving pixel array, and thin-film transistors (TFTs), and
    the image sensors and the TFTs are at least partially overlapped in a direction perpendicular to the array substrate; and
    a black matrix among the CF pixel units, and
    the orthographic projections of the image sensors on the second base substrate do not overlap an orthographic projection of the black matrix on the second base substrate.

2. An operation method of the display device according to claim 1, comprising executing shooting operation by using the image sensors during the non-display operation of the display panel.

3. The operation method of the display device according to claim 2, wherein the display device further includes a backlight; and
    the operation method further comprises turning off the backlight during the shooting operation.

4. A display panel, comprising a color filter (CF) substrate and an array substrate opposite to and assembled with the CF substrate, wherein the CF substrate comprises:
    a first base substrate;

a CF pixel array provided on the first base substrate and including CF pixel units in an array; and image sensors on the CF pixel array, the image sensors are provided to correspond to at least part of CF pixel units, and configured to receive light travelling through the CF pixel units for imaging; and wherein the array substrate comprises a second base substrate, a driving pixel array on the second base substrate corresponding to the CF pixel array of the CF substrate, the driving pixel array comprises open areas for display, and non-display areas among the open areas, the open areas of the driving pixel array respectively correspond to the CF pixel units, and orthographic projections of the image sensors on the second base substrate are fall within the non-display areas of the driving pixel array, and thin-film transistors (TFTs), and the image sensors and the TFTs are at least partially overlapped in a direction perpendicular to the array substrate; wherein the orthographic projections of the image sensors on the second base substrate overlap entire orthographic projections of the thin film transistors, respectively.

5. The display panel according to claim 4, wherein wherein the image sensors are provided between the base substrate of the CF substrate and the array substrate.

6. The display panel according to claim 5, wherein the thin-film transistors (TFTs) are provided in the non-display area.

7. A method of manufacturing the display panel according to claim 4.

8. The method of manufacturing the display panel according to claim 7, comprising:
forming the image sensors on the CF pixel array by a semiconductor process.

9. The method of manufacturing the display panel according to claim 8, wherein the forming of the image sensors on the CF pixel array includes:
forming a first protective layer at least covering the CF pixel array;
forming the image sensors on the first protective layer by a semiconductor process; and
forming a second protective layer covering the CF pixel array and the image sensors.

10. The method of manufacturing the display panel according to claim 7, wherein the forming of the image sensors on the CF pixel array includes:
providing the image sensors on a support substrate; and
fixing the support substrate on the CF pixel array.

11. The display panel according to claim 4, further comprising a first protective layer at least covering the CF pixel array, and the image sensors is provided on the first protective layer.

12. The display panel according to claim 11, wherein the first protective layer is a single-layer structure or a multi-layer structure including silicon nitride, silicon oxide, or silicon oxynitride.

13. The display panel according to claim 12, further comprising a second protective layer covering the CF pixel array and the image sensors on the CF pixel array.

14. The display panel according to claim 13, wherein the second protective layer comprise resin material.

15. The display panel according to claim 4, further comprising a support substrate, wherein the image sensors are provided on the support substrate, and the support substrate is fixed on the CF pixel array.

16. The display panel according to claim 4, wherein the image sensors include imaging pixel units; and the imaging pixel units are in one-to-one correspondence with the CF pixel units.

17. The display panel according to claim 16, wherein the CF pixel units comprises red pixel units, green pixel units, blue pixel units, yellow pixel units, cyan pixel units, and magenta pixel units.

18. The display panel according to claim 13, wherein the second protective layer is multiplexed as an alignment layer.

19. A display panel, comprising a color filter (CF) substrate and an array substrate opposite to and assembled with the CF substrate, wherein the CF substrate comprises:
a first base substrate;
a CF pixel array provided on the first base substrate and including CF pixel units in an array;
image sensors on the CF pixel array, the image sensors are provided to correspond to at least part of CF pixel units, and configured to receive light travelling through the CF pixel units for imaging;
wherein the array substrate comprises a second base substrate, a driving pixel array on the second base substrate corresponding to the CF pixel array of the CF substrate, the driving pixel array comprises open areas for display, and non-display areas among the open areas, the open areas of the driving pixel array respectively correspond to the CF pixel units, and orthographic projections of the image sensors on the second base substrate are fall within the non-display areas of the driving pixel array, and thin-film transistors (TFTs), and the image sensors and the TFTs are at least partially overlapped in a direction perpendicular to the array substrate; and
a black matrix among the CF pixel units;
the orthographic projections of the image sensors on the second base substrate do not overlap an orthographic projection of the black matrix on the second base substrate.

* * * * *